(12) United States Patent
Burr

(10) Patent No.: US 6,218,708 B1
(45) Date of Patent: *Apr. 17, 2001

(54) BACK-BIASED MOS DEVICE AND METHOD

(75) Inventor: James B. Burr, Foster City, CA (US)

(73) Assignee: Sun Microsystems, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,030

(22) Filed: Feb. 25, 1998

(51) Int. Cl.$^7$ ................................................. H01L 29/76

(52) U.S. Cl. ............................................................ 257/372

(58) Field of Search ..................................... 257/372, 373, 257/509, 655, 370, 335

(56) References Cited

U.S. PATENT DOCUMENTS

| | | | | |
|---|---|---|---|---|
| 4,910,563 | * | 3/1990 | Tuska et al. | 257/372 |
| 4,980,744 | * | 12/1990 | Watanabe et al. | 257/372 |
| 5,138,420 | * | 8/1992 | Komori et al. | 257/372 |
| 5,508,549 | * | 4/1996 | Watanabe et al. | 257/372 |

\* cited by examiner

*Primary Examiner*—Olik Chaudhuri
*Assistant Examiner*—Nathan Ha
(74) *Attorney, Agent, or Firm*—Rosenthal & Osha, L.L.P.

(57) ABSTRACT

An MOS device has source and drain regions of a first conductivity formed in a well of a second conductivity, the well of the second conductivity being formed in an upper surface of a bulk material of the first conductivity. Source and drain potentials are applied to the source and drain regions, respectively, while a separate bias potential is routed to the well through a conductive sub-surface layer of the second conductivity which is located spaced from and beneath an upper surface of the bulk material and which is shorted to the well.

16 Claims, 5 Drawing Sheets

BACK-BIASED MOS DEVICE AND METHOD

BACKGROUND OF THE INVENTION

1. Field of the Invention

The present invention generally relates to complimentary metal oxide semiconductor (CMOS) transistor devices, and in particular, the present invention relates a device structure and method which facilitate the retrofitting of standard CMOS design layouts into back-biased CMOS transistor configurations. Although not limited thereto, the invention is especially applicable to low-voltage CMOS (LVCMOS), or ultra-low power CMOS (ULP), implementations.

2. Description of the Related Art

FIG. 1(a) illustrates a standard CMOS inverter design having an NFET 101 and a PFET 102, each of which essentially constitutes a three-terminal device. Basic component parts of the NFET 101 include an n-region source 103, a gate electrode 104, an n-region drain 105, and a $p^-$ bulk substrate 106. Typically, the layer 106 is a $p^-$ epitaxial layer grown on a $p^+$ substrate 100. The NFET 101 may be formed in a p-well 107 as shown. The PFET 102 includes p-region source 108, a gate electrode 109, a p-region drain 110, and an n-well 111. In addition, reference numeral 112 denotes a $p^+$ plug which forms a bulk terminal or well tie for the bulk material 106, and reference numeral 113 is representative of an $n^+$ plug forming a well tie for the n-well 111.

In the exemplary CMOS design of FIG. 1(a), the well contact 112 of the bulk material 106 is shorted to the grounded source terminal 103 of the NFET 101 by way of a metallic rail contact 114. Likewise, the well contact 113 of the n-well 111 is shorted to the source terminal 108, connected to a source voltage Vdd, by way of a metallic rail contact 115. Thus, in this example, the substrate bias of the NFET 101 is fixed at GND, and that of the PFET 102 is fixed at Vdd.

FIG. 1(b) illustrates a similar design, except that the substrate or bulk of the NFET 101 is biased to ground by way of a metallic back plane 116, rather than by way of the well tie 112 shown in FIG. 1(a).

It is noted that in the three terminal inverter design of FIGS. 1(a) and 1(b), a source of the NFET is tied to ground and the same of the PFET is tied to Vdd. While the source is tied to ground or Vdd in the case of inverters, such is not the case for compound gate structures with transistors in series, or pass transistor logic. In these topologies, some of the devices may be four terminal devices having different source and bulk potentials.

There are a number of factors which contribute to the magnitude of a transistor device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations (such as oxide thickness, and channel width and especially channel length), charge trapping in materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations.

This can be accomplished using back biasing, i.e. controlling the potential between a device's well and source. See James B. Burr, "Stanford Ultra Low Power CMOS," Symposium Record, Hot Chips V, pp. 7.4.1–7.4.12, Stanford, Calif. 1993, which is incorporated herein by reference for all purposes.

A basic characteristic of back-biased transistors resides in the ability to electrically tune the transistor thresholds. This is achieved by reverse biasing the bulk of each MOS transistor relative to the source to adjust the threshold potentials. Typically, the potential will be controlled through isolated ohmic contacts to the source and well regions together with circuitry necessary for independently controlling the potential of these two regions. Exemplary of this is the structure FIG. 2(a), which illustrates a configuration in which the well contacts are split off from the source contacts.

That is, in the exemplary CMOS configuration of FIG. 2(a), each of an NFET 201 and a PFET 202 essentially constitutes a four-terminal device. As in FIG. 1, the NFET 201 is made up of an n-region source 203, a gate electrode 204, an n-region drain 205, and a $p^-$ bulk substrate 206. Again, the NFET 201 may also include a p-well 207 as shown. Similarly, the PFET 202 includes p-region source 208, a gate electrode 209 and a p-region drain 210 formed in an n-well 211. Reference numeral 212 is a $p^+$ plug which forms a bulk terminal or well tie for the bulk material 206, and reference numeral 213 is an $n^+$ plug forming a well tie for the n-well 211.

In the back-biased CMOS design of FIG. 2(a), the well contact 212 of the bulk material 206 is split off from the source terminal 203 of the NFET 201 by providing a separate metallic rail contact 216 which is spaced from the metallic rail contact 214 of the source terminal 203. Rail contact 216 is connected to a bias voltage source Vpw. Likewise, the well contact 213 of the n-well 211 is split off from the source terminal 208 of the PFET 202 by providing a separate metallic rail contact 218 which is spaced from the metallic rail contact 215 of the source terminal 208. Rail contact 218 is connected to a bias voltage source Vnw. Thus, in this example, the substrate bias potential of the NFET 201 is set by Vpw, and that of the PFET 202 is set by Vnw. It is noted that in other designs, in which a number of transistors are formed in a common well, the bias potential may be routed within the surface well.

FIG. 2(b) illustrates a similar design, except that the substrate or bulk of the NFET 201 is biased to Vpw by way of a metallic back plane 219, rather than by way of the well tie 216 shown in FIG. 2(a).

Splitting off the well ties as in FIGS. 2(a) and 2(b) is a relatively simple exercise in the case where the configuration is designed into the methodology from the outset. On the other hand, in the case of existing designs not employing back-biasing, since necessary alterations include modifying the surface layout of the design, retrofitting after the fact to allow for splitting off well ties is intensively time-consuming.

This process of modifying the layout to split off the well ties includes first removing the well ties that are connected to the supply rails and then finding some space in the layout to allow for rails to separately carry the substrate potentials. There are these serious issues, particularly with respect to large complex layouts having high component densities. Many designs already utilize most, if not all, available surface area, and the provision of extra metallic rails is a severe design challenge in many instances.

SUMMARY OF THE INVENTION

It is thus an object of the present invention to provide a back-biased MOS device structure and method.

It is a further object of the present invention to provide a back biased MOS device structure and method which facilitate retrofitting of standard MOS designs into back biased configurations without substantially impacting the standard design layout.

According to one aspect of the present invention, a method of back-biasing an MOS transistor is provided, the MOS transistor having source and drain regions of a first conductivity formed in a well of a second conductivity, the well of the second conductivity formed in an upper surface of a bulk material of the first conductivity. The method includes applying source and drain potentials to the source and drain regions, respectively, and routing a separate bias potential to the well through a conductive sub-surface layer of the second conductivity which is located spaced from and beneath an upper surface of the bulk material and which is shorted to the well.

According to another aspect of the present invention, an MOS device is provided which includes a bulk material of a first conductivity having a principal surface; a well of a second conductivity formed in the principal surface of the bulk material; source and drain regions of the first conductivity formed in the well to define a channel region therebetween; and a conductive sub-surface layer of the second conductivity spaced from and beneath the surface of the bulk material and contacting the well.

According to still another aspect of the present invention, an MOS device is provided which includes a bulk material of a first conductivity having a principal surface; a plurality of wells of a second conductivity formed in the principal surface of the bulk material; a plurality of source and drain regions of the first conductivity formed in each of the plurality of wells to define respective channel regions therebetween; and a conductive sub-surface layer of the second conductivity spaced from and beneath the surface of the bulk material and contacting the plurality of wells.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENTS

A CMOS configuration is presented which allows the well ties of an existing design to be split off without affecting the layout except in a local and simple manner. The configuration routes the substrate potentials beneath the substrate surface in wells, thereby avoiding surface rails which would otherwise be needed for back-biasing the transistor devices.

That is, the substrate potentials are routed in one or more conductive sub-surface well layers as opposed to surface metal layers. The advantage of this approach is that while typically there is little or no room on the densely packed substrate surface of the design layout for extra metallic rails, the area beneath the substrate surface is often underutilized due to the fact that routing signals through wells is generally prohibited by the poor frequency response and high resistance of the wells. In this invention, however, the wells are not carrying signals. Rather, the wells function to hold a substrate potential and are characterized by a high capacitance. As such, any local noise that gets coupled into the wells is largely attenuated.

Figure 1A:
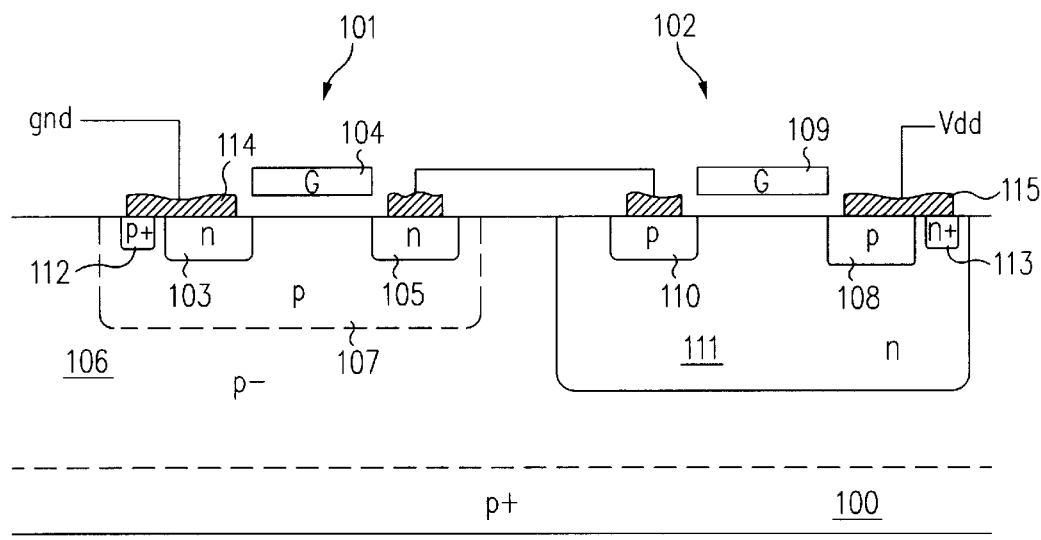
FIGS. 1(a) and 1(b) illustrate conventional CMOS inverter configurations in which the substrate potentials are tied to the ground and source voltages.
Figure 1B:
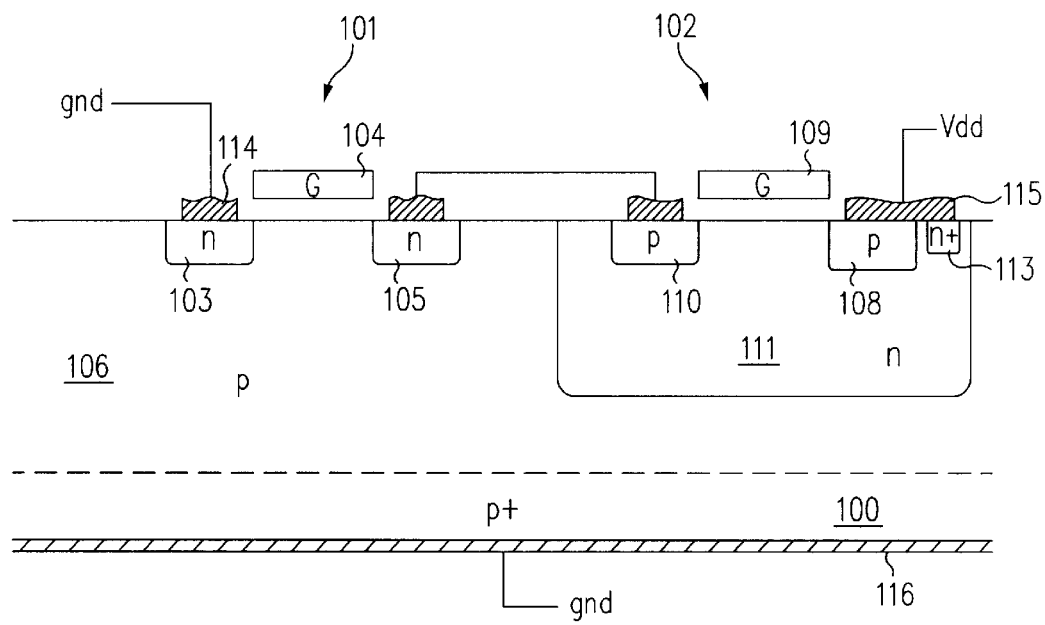
Figure 2A:
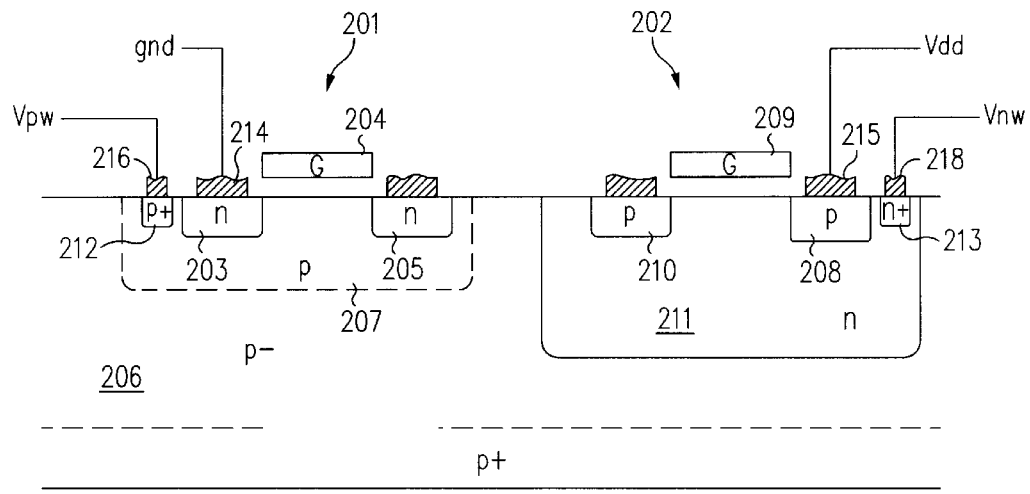
FIGS. 2(a) and 2(b) illustrate conventional CMOS configurations in which the substrate potentials are biased by the spitting off of well contacts.
Figure 2B:
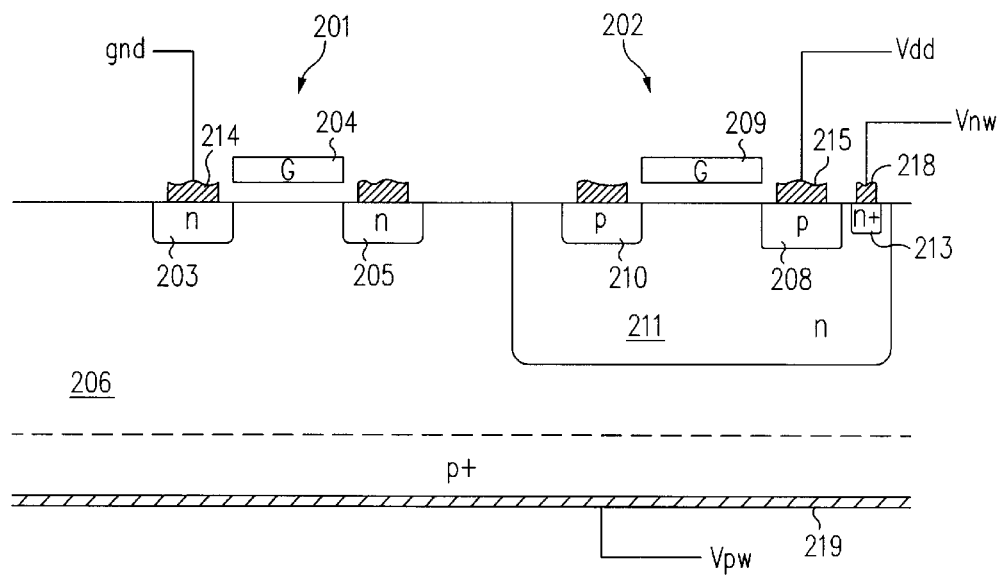
Figure 3:
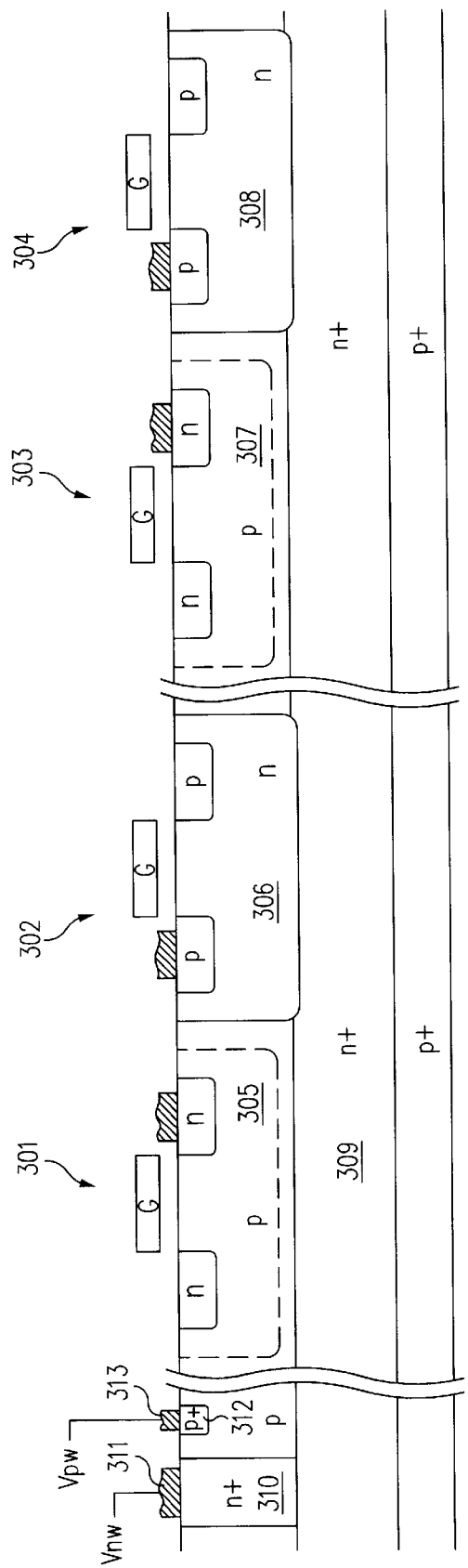
FIG. 3 illustrates a cross-sectional view of a back-biased CMOS configuration according to one configuration of the present invention.

Turning now to FIG. 3, a back-biased CMOS configuration according to one configuration of the present invention is shown. The configuration is at least partially characterized by the provision of a semiconductor sub-surface layer, as opposed to a metal surface layer or rail, for carrying the back-bias substrate potential Vnw of the PFET n-wells.

As shown, NFETs 301 and 303 are contained in p-type bulk material wells or regions 305 and 307, whereas PFETs 302 and 304 are formed in respective n-type wells 306 and 308. In some cases, the CMOS configuration may contain multiple n-type wells extending in parallel, spaced-apart tracks. In other cases, a generally rectangular n-well may be formed in which CMOS transistor pairs are formed along inner and outer peripheries thereof Other configurations are known as well. Also, oxide layers and the like (not shown) are used to isolate transistors and transistor pairs from one another. It should be borne in mind that the many advantages of the back-biasing technique of the invention will apply regardless of the particularities of the CMOS configuration. Rather, the invention is believed to be applicable to any configuration having one or more wells to which application of a substrate back-bias potential is desired.

Referring still to FIG. 3, an $n^+$ layer 309 is used to route the bias potential Vnw to the n-wells 306 and 308. Potential Vnw is applied to the $n^+$ layer 309 via an $n^+$ plug 310, which in turn is coupled to a metallic surface contact 311 which receives the bias potential Vnw. In this configuration, the bias potential Vnw is applied to the n-wells 306 and 308 via the conductive metallic contact 311, the conductive $n^+$ plug 310 and the conductive $n^+$ layer 309. The conductive $n^+$ plug 310 may be formed instead of a metal filled trench having insulated side-walls, or the like.

Figure 4A:
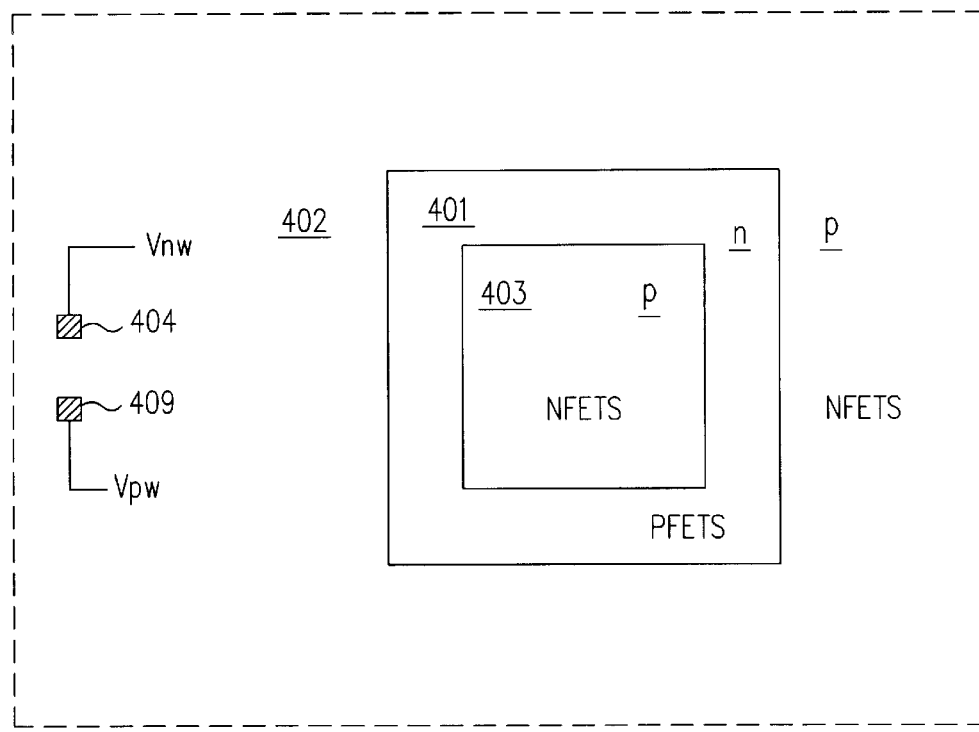
FIGS. 4(a) and 4(b) are top-views of a back-biased CMOS configuration according to alternative configurations of the present invention.

The $n^+$ plug 310 and metallic contact 311 need only be localized at the substrate surface, as opposed to a rail extending lengthwise along the design layout, thus minimizing the surface area needed for back-biasing the CMOS n-wells. An example of this is shown in FIG. 4(a). That is, in FIG. 4(a), a generally rectangular n-well 401 contains PFETs, whereas NFETs are located in p-regions 402 and 403. A single local surface contact 404 is provided in the substrate surface so as to extend down to and contact a conductive $n^+$ layer buried within the substrate, with the $n^+$ layer contacting the n-well as generally shown in FIG. 3. The bias potential Vnw is applied to the local contact 404 to generate the desired back biasing of the PFETs.

The back-bias potential for the NFETs may be supplied by way of a localized $p^+$ plug 312 and metallic contact 313 shown in FIG. 3. The top view of FIG. 4(a) similarly shows the local metallic contact 409 for application of the bias potential Vpw. Again, it is noted that the p-layer need only function to hold a substrate potential, and the characteristically high well resistance is not prohibitive in this respect.

In some configurations, the conductive $n^+$ layer for routing the bias potential Vnw may isolate p regions from one another. For example, in FIG. 4(a), a continuous planar $n^+$ layer (such as the layer 309 shown in FIG. 3) would isolate the inner p region 403 from the outer p region 402. In this case, application of the bias potential Vpw to the local contact 409 would not effectively bias the inner p region 403.

One manner of handling isolated p regions is to provide at least one metallic surface contact and associated plug for each region. Each surface contact may be formed in a local area, or all surface contacts may be formed by interconnected rails or the like. This solution has the advantage of allowing for a continuous planar $n^+$ sub-surface layer, but utilizes surface area for the provision of multiple contacts or rails.

Figure 4B:
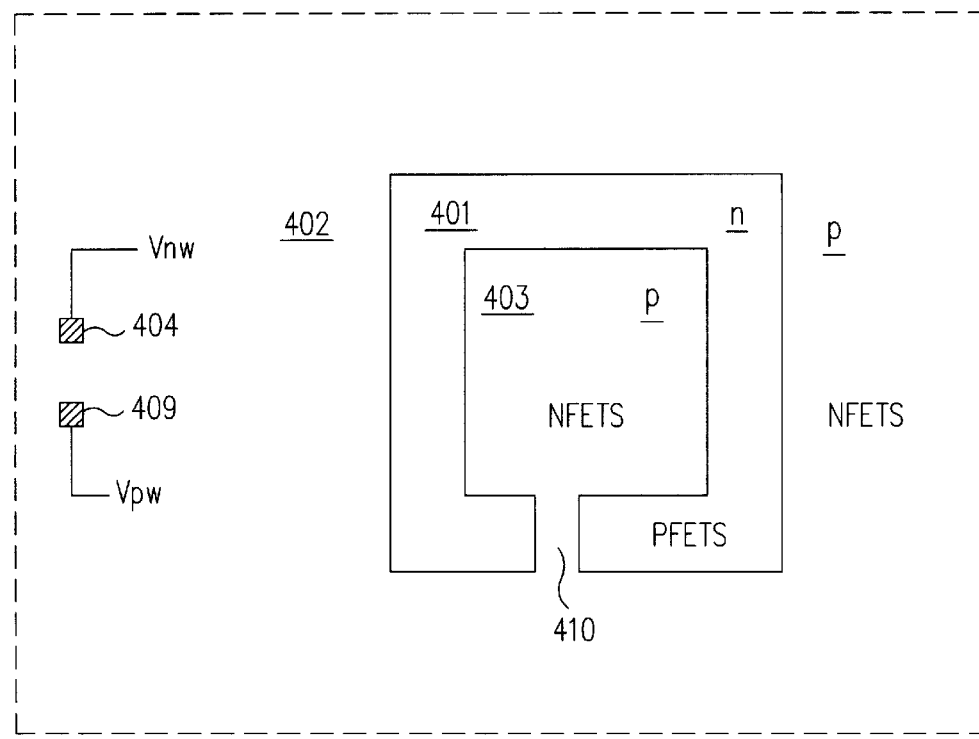

Another manner of handling the isolated p regions is to use a masking process to provide a perforation or gap within the n-well surrounding the isolated p-region. This is illustrated by way of example by reference numeral 410 in FIG. 4(b). As shown, a perforation or gap 410 is provided in the n-well 401, whereby the inner p-region 403 is electrically connected the outer p-region 402 via the perforation or gap 410.

Figure 5:
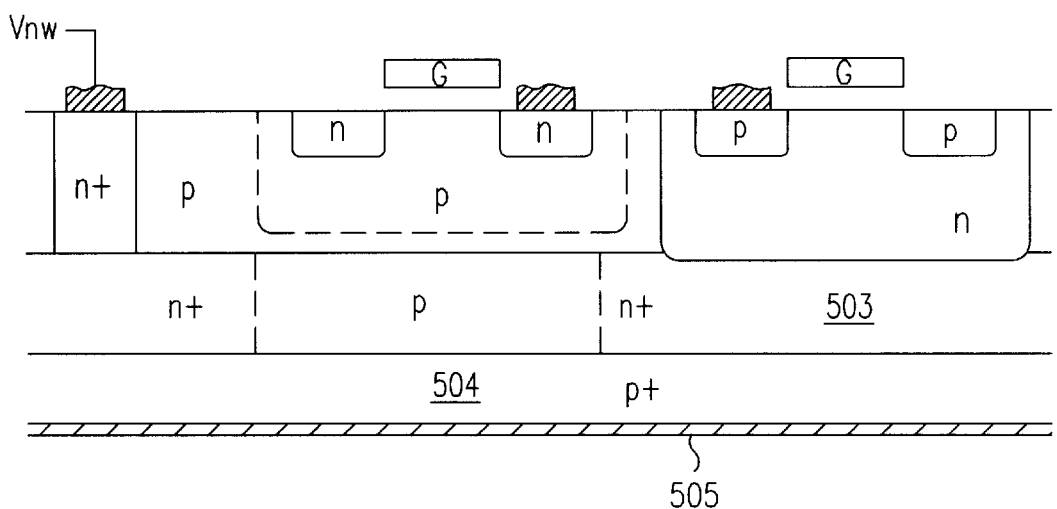
FIGS. 5 and 6 are views for explaining the routing of bias potentials to isolated bulk regions of a back-biased CMOS configuration according to one configuration of the present invention.
Figure 6:
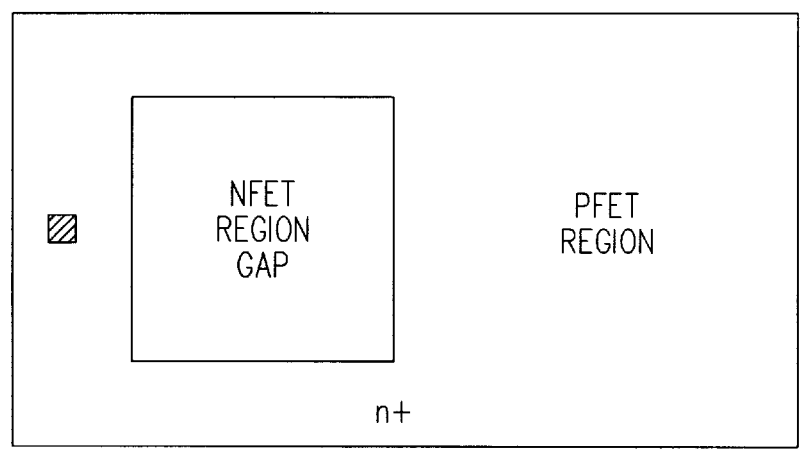

Yet another manner of handling isolated p regions uses a masking process to form a non-continuous or patterned subsurface $n^+$ layer (i.e., the layer which routes the Vnw potential) so as to route the back bias potential Vpw to the isolated p-region through a semiconductor sub-surface $p^+$ layer. An example of this technique is shown in FIGS. 5 and 6. In FIG. 5, the potential Vpw is applied to a back plate 505, which in turn contacts the $p^+$ substrate layer 504. The $n^+$ layer 503 (corresponding to layer 309 of FIG. 3) is non-continuous or patterned as generally illustrated in FIG. 6. As such, the $p^+$ substrate is shorted to the bulk material through gaps in the $n^+$ layer. Alternatively, the potential Vpw may be routed to the $p^+$ layer by way of a local surface contact and a $p^+$ plug or insulated metal filled trench extending downward from the substrate surface. The $p^+$ plug or trench need only contact the surface p-region, since the surface p-region will connect to the $p^+$ layer trough gaps in the $n^+$ layer.

As should thus be apparent, there are any number of possible variations of practicing the present invention. For example, in some instances, it may be difficult to deposit the buried n-well deep below the bulk material surface using implantation techniques. That is, the distribution may be too broad for a single implant. To overcome this possibility, a counterdoped buried well may be adopted, or alternatively, the n-well may be implanted into a conventional $p^-/p^+$ wafer. Further, the device may be configured by lamination of the $n^+$ layer. These and other alternatives are discussed below.

An objective is to keep the doping present in the bulk material light at the surface. Outside the channel, however, just a low net doping is needed. Also, it is not necessary to be overly precise as to the junction depth as long as it is sufficiently deep. One solution is to implant p-type impurities such that a desired concentration is achieved at the surface (for example, $1e15$ per $cm^3$), with the concentration increasing to a peak (for example, $2e17$ per $cm^3$) at a particular depth (for example, $0.4 \mu m$). A p-n junction would be clamped just below the peak. It may also be preferable to effect an extra-light n implant under the source/drain regions to reduce junction capacitance.

For example, a $0.4 \mu m$ junction with a $0.18 \mu m$ source drain junction depth would leave a $0.22 \mu m$ p-region under the source/drain. The depletion width at $NA=2e17$ per $cm^3$ is 74 nm with no voltage across the junction and 158 nm with 3 V of reverse bias. It is believed that indium would be most effective for this purpose. Also, it is believed that antimony would be preferable to arsenic for the deep well since antimony is heavier, thus going deeper and narrowing the distribution. That is, in one alternative, antimony may be used to form the deep well, and indium may be used as counterdoping to suppress the surface tail.

Another alternative embodiment resides in implanting the n-well layer into a conventional $p^-/p^+$ wafer. In this case, the epitaxial $p^-$ silicon may be grown after the $n^+$ implant. This allows the surface silicon to be lightly doped p, and the $n^+$ profile to be very steep. The surface $p^-$ layer should be thick enough to avoid outdiffusion from the buried $n^-$ layer to interfere with the device profiles. Yet another alternative is to laminate the $n^+$ layer onto the p type wafer, and then form the p-type silicon atop the $n^+$ laminate.

Yet another variation relates to the fact that chip designers are generally interested in improving ground and power distribution, normally by way of the metal system through the front side of the chip, by distributing ground through the substrate by contacting the back side of the wafer. This would make it difficult to back bias NFETs in an n-well process, because their bodies would be shorted to ground through the substrate.

However, a buried n-well layer may be used to separate ground connections from NFET p-wells. The $p^-$ substrate underneath the buried n-well layer can be grounded through a back-side contact. This $p^-$ substrate may then be connected to surface p-wells through openings in the buried n-well layer. These openings would be surrounded by surface n-wells to isolate them from the back-biased p-wells.

In this way, grounded surface p-wells and backbiased surface p-wells are separated by surface n-wells. The grounded p-wells would be connected through openings in the buried n-well layer to the underlying grounded $p^-$ substrate.

Also, as described above, the backbiased p-wells are lightly doped. This may be a problem with regard to minimizing local potential fluctuations due to capacitive coupling to switching drains. In this case, a $p^+$ layer could be implanted or grown above the $n^+$ layer to provide a low resistance path for back biasing the NFETs.

In principle, any number of $p^+/n^+$ layers could be built up to provide multiple interconnection planes for routing power supplies in the substrate rather than in metal.

This technique may be used to implement an isolated twin-well technology, wherein both NFETs and PFETs would have separate bias potentials supplied to different groups of devices. Backbiased p-wells would be surrounded by Vdd-connected n-wells, and backbiased n-wells would be isolated by ground-connected p-wells.

If there were 6 planes: vdd, gnd, vnw, vpw, vnwmax, and vpwmax, then back bias generation would be a simple matter of periodically transferring charge from the vnwmax plane to the vnw plane and the vpwmax plane to the vpw plane. In this case it would make the most sense to have vnwmax and vpwmax perform the isolation function. Backbiased p-wells would be surrounded by vnwmax-connected n-wells, and backbiased n-wells would be isolated by vpwmax-connected p-wells. There could in fact be fewer than 6 layers if multiple functions were merged on a single layer.

Modification of an original layout in an n-well process will now be described by way of an example. First the existing substrate and well contacts are removed from the design. This step may be completely automated and require no manual manipulation of data. Optionally, a mask is generated to define a buried n-well layer which is used to interconnect the n-wells. This may be a uniform sheet, or it may be a grid so that the low resistance p⁻ substrate is made to contact the high-resistance p⁻ epi layer. From the surface n-well mask an n-well is then constructed which connects the surface n-wells to the buried n-well layer. Again, in many cases, this can be automated. The n-well via mask will often be the same as the n-well mask. If there are n-well rings which would otherwise create isolated p-wells, the n-well via mask is provided with gaps in the n-well rings to provide connectivity to the isolated p-wells. Finally, somewhere in the layout, the substrate and well ties are placed. This is a manual, but local variation. The bulk potentials are then distributed thoughout the chip in wells, as opposed to surface metals.

In practice, it is believed that a preferred configuration will be to distribute gnd through the back side, vdd through the metal system, vnw through an n⁺ buried layer, and vpw through a p⁺ buried layer. This would require a p⁺ substrate, an n⁺ layer, a p⁺ layer, and a surface p⁻ layer.

The technique of the present invention resides in the use of one or more semiconductor sub-surface layers to route the back bias potential to the PFET and/or NFET wells. This reduces or largely eliminates the need for surface metals, thus increasing surface densities and facilitating retrofitting of densely packed existing designs. Many structural variations for realizing sub-surface routing of back-bias potentials may be contemplated by those skilled in the art. In this respect, the present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling within the scope of the invention.

What is claimed is:

1. An MOS device comprising:
    a bulk material of a first conductivity having a principal surface;
    a well of a second conductivity formed in said principal surface of said bulk material;
    source and drain regions of the first conductivity formed in said well to define a channel region therebetween;
    a first conductive sub-surface layer of the second conductivity spaced from and beneath said surface of said bulk material and contacting said well;
    a metal contact on said principal surface of said bulk material; and
    a conductive region extending through said bulk material between said metal contact and said first conductive sub-surface layer, wherein the conductive region applies a bias potential to said well via said first conductive sub-surface layer.

2. An MOS device as claimed in claim 1, further comprising:
    second source and drain regions of the second conductivity formed in the bulk material to define a second channel region therebetween; and,
    a second metallic contact on said surface of said bulk material, said second metal contact for applying a second bias potential to said bulk material.

3. An MOS device as claimed in claim 1, further comprising:
    second source and drain regions of the second conductivity formed in the bulk material to define a second channel region therebetween; and
    a second conductive sub-surface layer of the first conductivity located below said first conductive sub-surface layer such that said first conductive sub-surface layer is located between said second conductive sub-surface layer and said surface of said bulk material;
    wherein said first conductive sub-surface layer has at least one gap defined therein and said second conductive sub-surface layer is shorted to said bulk material through said at least one gap.

4. An MOS device as claimed in claim 3, further comprising a second metallic contact connected to said second conductive sub-surface layer, said second metal contact for applying a second bias potential to said bulk material via said second conductive sub-surface layer.

5. An MOS device as claimed in claim 4, wherein said second metal contact is a metal back plate shorted to said second conductive sub-surface layer.

6. An MOS device as claimed in claim 3, further comprising a second metallic contact on said surface of said bulk material, said second metal contact for applying a second bias potential to said second conductive sub-surface layer via said bulk material and through said at least one gap.

7. An MOS device as claimed in claim 1, wherein said conductive sub-surface layer is an implanted buried layer contained within said bulk material.

8. An MOS device as claimed in claim 1, wherein said bulk material is an epitaxial layer grown on said conductive sub-surface layer.

9. An MOS device comprising:
    a bulk material of a first conductivity having a principal surface;
    a plurality of wells of a second conductivity formed in said principal surface of said bulk material;
    a plurality of source and drain regions of the first conductivity formed in each of said plurality of wells to define respective channel regions therebetween;
    a first conductive sub-surface layer of the second conductivity spaced from and beneath said surface bulk material and contacting said plurality of wells;
    a metal contact on said principal surface of said bulk material; and
    a conductive region extending through said bulk material between said metal contact and said first conductive sub-surface layer, wherein the conductive region applies a bias potential to said plurality of wells via said first conductive sub-surface layer.

10. An MOS device as claimed in claim 9, further comprising:
    second source and drain regions of the second conductivity formed in the bulk material to define a second channel region therebetween; and,
    a second metallic contact on said surface of said bulk material, said second metal contact for applying a second bias potential to said bulk material.

11. An MOS device as claimed in claim 9, further comprising:
- second source and drain regions of the second conductivity formed in the bulk material to define a second channel region therebetween; and
- a second conductive sub-surface layer of the first conductivity located below said first conductive sub-surface layer such that said first conductive subsurface layer is located between said second conductive sub-surface layer and said surface of said bulk material;
- wherein said first conductive sub-surface layer has at least one gap defined therein and said second conductive sub-surface layer is shorted to said bulk material through said at least one gap.

12. An MOS device as claimed in claim 11, further comprising a second metallic contact connected to said second conductive sub-surface layer, said second metal contact for applying a second bias potential to said bulk material via said second conductive sub-surface layer.

13. An MOS device as claimed in claim 12, wherein said second metal contact is a metal back plate shorted to said second conductive sub-surface layer.

14. An MOS device as claimed in claim 11, further comprising a second metallic contact on said surface of said bulk material, said second metal contact for applying a second bias potential to said second conductive sub-surface layer via said bulk material and through said at least one gap.

15. An MOS device as claimed in claim 9, wherein said conductive sub-surface layer is an implanted buried layer contained within said bulk material.

16. An MOS device as claimed in claim 9, wherein said bulk material is an epitaxial layer grown on said conductive sub-surface layer.

* * * * *